(12) United States Patent
Cassese et al.

(10) Patent No.: US 12,426,331 B2
(45) Date of Patent: Sep. 23, 2025

(54) POWER SEMICONDUCTOR DEVICE AND METHOD OF PRODUCING A POWER SEMICONDUCTOR DEVICE

(71) Applicant: Infineon Technologies AG, Neubiberg (DE)

(72) Inventors: Damiano Cassese, Villach (AT); Andreas Korzenietz, Putzbrunn (DE); Holger Schulze, Villach (AT); Frank Umbach, Munich (DE)

(73) Assignee: Infineon Technologies AG, Neubiberg (DE)

( * ) Notice: Subject to any disclaimer, the term of this patent is extended or adjusted under 35 U.S.C. 154(b) by 400 days.

(21) Appl. No.: 17/881,740

(22) Filed: Aug. 5, 2022

(65) Prior Publication Data
US 2023/0048908 A1      Feb. 16, 2023

(30) Foreign Application Priority Data

Aug. 12, 2021   (DE) .......................... 102021121043.7

(51) Int. Cl.
| H10D 64/01 | (2025.01) |
| H10D 62/10 | (2025.01) |
| H10D 64/00 | (2025.01) |

(52) U.S. Cl.
CPC ........... H10D 64/01 (2025.01); H10D 62/107 (2025.01); H10D 64/111 (2025.01)

(58) Field of Classification Search
CPC . H01L 29/401; H01L 29/0623; H01L 29/402; H01L 29/4925; H01L 21/28061; H01L 29/0619; H01L 29/0638; H01L 29/7813; H10D 64/01; H10D 62/107; H10D 64/111; H10D 30/668; H10D 64/662; H10D 62/106; H10D 62/112
See application file for complete search history.

(56) References Cited

U.S. PATENT DOCUMENTS

| 4,753,895 A | 6/1988 | Mayer et al. |
| 6,005,284 A | 12/1999 | Ejiri et al. |
| 6,893,929 B1 * | 5/2005 | Xiang ............... H01L 21/76237 438/303 |

(Continued)

FOREIGN PATENT DOCUMENTS

WO    8904548 A2    5/1989

OTHER PUBLICATIONS

Lutz, Josef, "Halbleiter-Leistungsbauelemente", Physik, Eigenschaften, Zuverlässigkeit, Springer-Verlag Berlin Heidelberg, 2012, pp. 1-4.

(Continued)

*Primary Examiner* — Steven B Gauthier
*Assistant Examiner* — Khatib A Rahman
(74) *Attorney, Agent, or Firm* — Murphy, Bilak & Homiller, PLLC

(57) ABSTRACT

A method of producing a power semiconductor device includes: providing a semiconductor body; forming, at the semiconductor body, a polycrystalline semiconductor region; forming, at the polycrystalline semiconductor region, an amorphous sublayer; subjecting the amorphous sublayer to a re-crystallization processing step to form a re-crystallized sublayer; and forming a metal layer at the re-crystallized sublayer.

17 Claims, 4 Drawing Sheets

(56) References Cited

U.S. PATENT DOCUMENTS

| | | | |
|---|---|---|---|
| 7,972,947 B2* | 7/2011 | Giles | H01L 21/26566 |
| | | | 438/528 |
| 9,269,591 B2* | 2/2016 | Kalnitsky | H10D 62/57 |
| 10,192,779 B1* | 1/2019 | Shank | H01L 21/324 |
| 2006/0154429 A1 | 7/2006 | De et al. | |
| 2008/0096370 A1* | 4/2008 | Anderson | H01L 21/823878 |
| | | | 438/479 |
| 2009/0108301 A1 | 4/2009 | Yin et al. | |
| 2013/0012008 A1* | 1/2013 | Ko | H01L 21/324 |
| | | | 257/E21.334 |
| 2014/0284615 A1* | 9/2014 | Mauder | H01L 29/0661 |
| | | | 257/77 |
| 2017/0194151 A1 | 7/2017 | Zhang et al. | |
| 2018/0006145 A1* | 1/2018 | Xiong | H01L 29/7809 |
| 2019/0051677 A1* | 2/2019 | Liu | H01L 27/092 |
| 2020/0381421 A1 | 12/2020 | Suganuma | |
| 2021/0020777 A1* | 1/2021 | Pfirsch | H01L 21/266 |

OTHER PUBLICATIONS

Morehead, F. F., et al., "Formation of Amorphous Silicon by Ion Bombardment as a Function of Ion, Temperature, and Dose", J. Appl. Phys., vol. 43, No. 3, Mar. 1972, pp. 1112-1118.

* cited by examiner

POWER SEMICONDUCTOR DEVICE AND METHOD OF PRODUCING A POWER SEMICONDUCTOR DEVICE

TECHNICAL FIELD

This specification refers to embodiments of a power semiconductor device and to embodiments of a method of producing a power semiconductor device. Aspects of the present disclosure are in particular related to a transition between a metal region and a polycrystalline semiconductor region.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate or control electrode. For example, upon receiving a corresponding control signal from, e.g., a driver unit, the control electrode may set the power semiconductor device in one of a forward conducting state and a blocking state. In some cases, the gate electrode may be included within a trench of the power semiconductor switch, wherein the trench may exhibit, e.g., a stripe configuration, or a planar configuration, or a needle configuration.

Some power semiconductor devices further provide a reverse conductivity; during a reverse conducting state, the power semiconductor device conducts a reverse load current. Such devices may be designed such that the forward load current capability (in terms of magnitude) is substantially the same as the reverse load current capability. A typical device that provides for both forward and reverse load current capability is the reverse conducting (RC) IGBT.

The power semiconductor devices are often equipped with several electrodes that are based on polycrystalline semiconductor material, such as trench electrodes, field plate electrodes, contact electrodes, integrated resistors, integrated diodes and the like. Such electrodes may serve various purposes; some electrodes may be left electrically floating, others may be connected to a defined electrical potential. E.g., said field plate electrodes may be electrically connected to a load terminal of the power semiconductor device such that the field plate electrodes exhibit the same electrical potential as the load terminal, e.g., the source or emitter potential.

In view of the aforesaid, situations may occur where an electrode based on a polycrystalline semiconductor material, such as polycrystalline silicon, is in electrical connection, e.g., in contact with a metal, including, e.g., aluminum, silicon and/or copper. This may lead to a dissolution of the polycrystalline semiconductor material (e.g., polycrystalline silicon) into the metal.

SUMMARY

According to an embodiment, a method of producing a power semiconductor device comprises providing a semiconductor body; forming, (directly or indirectly) at the semiconductor body, a polycrystalline semiconductor region; forming, at the polycrystalline semiconductor region, an amorphous sublayer; subjecting the amorphous sublayer to a re-crystallization processing step to form a re-crystallized sublayer; and forming a metal layer (directly or indirectly) at the re-crystallized sublayer.

According to another embodiment, a power semiconductor device comprises a semiconductor body; a first terminal; a metal layer; a poly crystalline semiconductor region; and between and in contact with both the metal layer and the poly crystalline region, a sublayer. An average grain size in the sublayer is greater than 120% of an average grain size in the polycrystalline semiconductor region. Additionally or alternatively, the sublayer includes, e. g. non-doping, implantation impurities having a mass equal or greater than the mass of phosphorus ions.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1A:
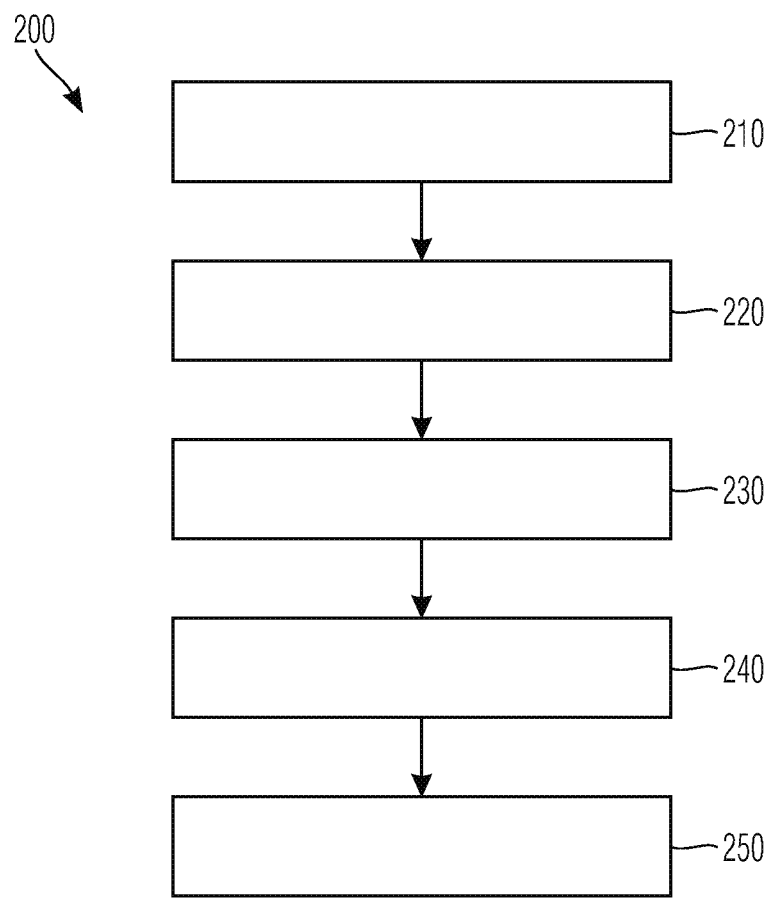
FIG. 1A to 1C schematically and exemplarily illustrates a method of producing a power semiconductor device in accordance with several embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned herein can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned herein may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metal or an electrode and a portion or part of a semiconductor device. Further, in the context of the present specification, the term "in contact" intends to describe that there is a direct physical connection between two elements of the respective semiconductor device; e.g., a transition between two elements being in contact with each other does not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to a power semiconductor device, such as an IGBT, an RC IGBT, a MOSFET, a diode or derivatives thereof, e.g., a power semiconductor device to be used within a power converter or a power supply. Thus, in an embodiment, such power semiconductor device can be configured to carry a load current that is to be fed to a load and/or, respectively, that is provided by a power source. For example, the power semiconductor device may comprise a plurality of power semiconductor cells, such as monolithically integrated diode cells, derivatives of a monolithically integrated diode cell, monolithically integrated MOSFET or IGBT cells and/or derivatives thereof. Such diode/transistor cells may be integrated in a power semiconductor module. A plurality of such cells may constitute a cell field that is arranged within an active region of the power semiconductor device.

The term "power semiconductor device" as used in this specification intends to describe a power semiconductor device on a single chip with high voltage blocking and/or high current-carrying capabilities. In other words, embodiments of the power semiconductor device described herein are single chip power semiconductor devices configured for high current, typically in the Ampere range, e.g., up to several Ampere or up to several ten or hundreds Ampere, and/or high voltages of at least 20V, typically 200 V and above, e.g., up to at least 400 V or even more, e.g., up to at least 3 kV, or even up to 10 kV or more.

For example, the power semiconductor device described below may be a single chip power semiconductor device configured to be employed as a power component in a low-, medium- and/or high voltage application. Several single chip power semiconductor device may be integrated in a module so as to form a power semiconductor device module, e.g., for installation and use in a low-, medium- and/or high voltage application, such as a major home appliance, a general purpose drive, an electric-drive train, a servo drive, a traction, a (higher) power transmission facilities, etc.

For example, the term "power semiconductor device" as used in this specification is not directed to a logic semiconductor device used for, e.g., storing data, computing data and/or other types of semiconductor based data processing.

With respect to FIG. 1A, a method 200 of producing a power semiconductor device in accordance with an embodiment of the present disclosure shall be described. Method 200 comprises the following steps: providing (cf. step 210) a semiconductor body; forming (cf. step 220), at the semiconductor body, a polycrystalline semiconductor region; forming (cf. step 230), at the polycrystalline semiconductor region, an amorphous sublayer; subjecting (cf. step 240) the amorphous sublayer to a re-crystallization processing step to form a re-crystallized sublayer; and forming (cf. step 250) a metal layer at the re-crystallized sublayer.

The term "forming at . . . " as used in this specification intends to describe "forming directly at . . . " as well as "forming indirectly at . . . ". The term "forming at . . . " as used in this specification aims at a resulting mechanical connection between the both portions. For example, "forming the polycrystalline semiconductor region at the semiconductor body" includes the formation of the polycrystalline semiconductor region in direct contact to the semiconductor body as well as indirect (without direct) contact to the semiconductor body, e. g. with one or more layers or regions in-between. Therefore, "forming the polycrystalline semiconductor region at the semiconductor body" intends to mean "the polycrystalline semiconductor region in direct contact to the semiconductor body or, e. g. via with the one or more layers or regions in-between, in indirect contact to the semiconductor body. This applies analogously to the metal layer being formed at the re-crystallized sublayer.

Figure 1C:
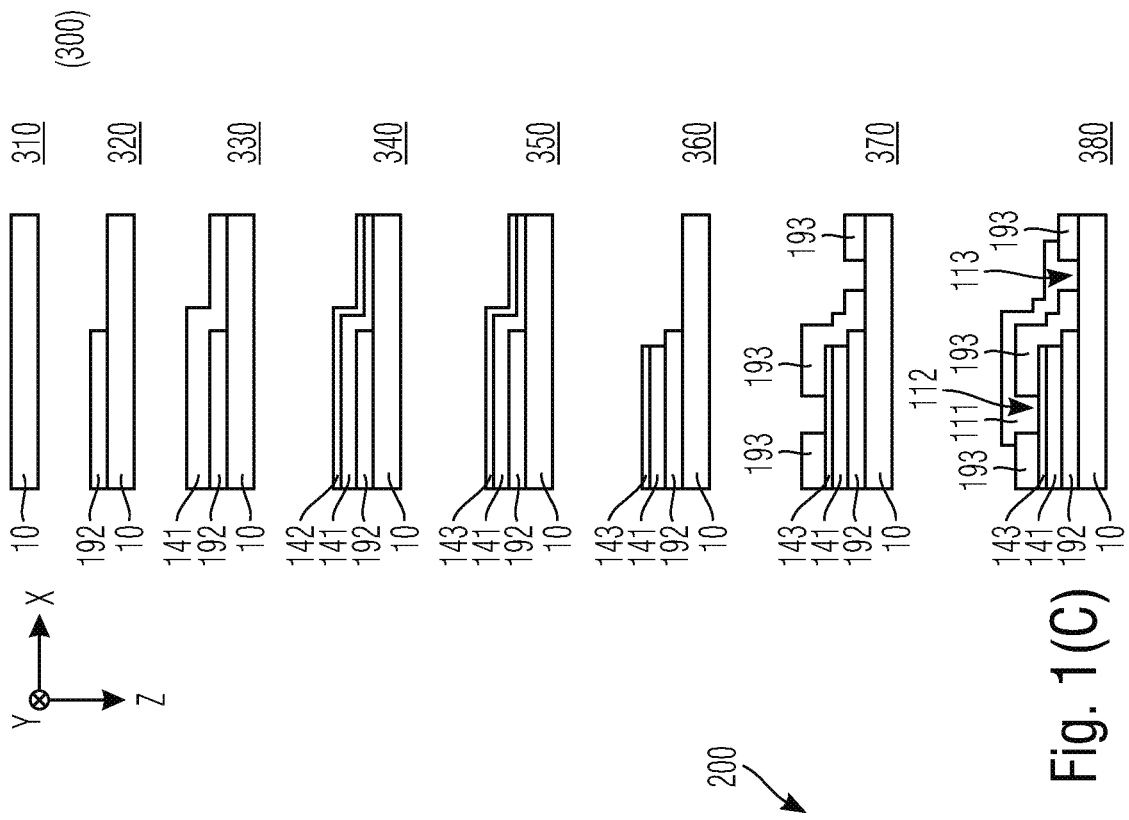
Figure 1B:
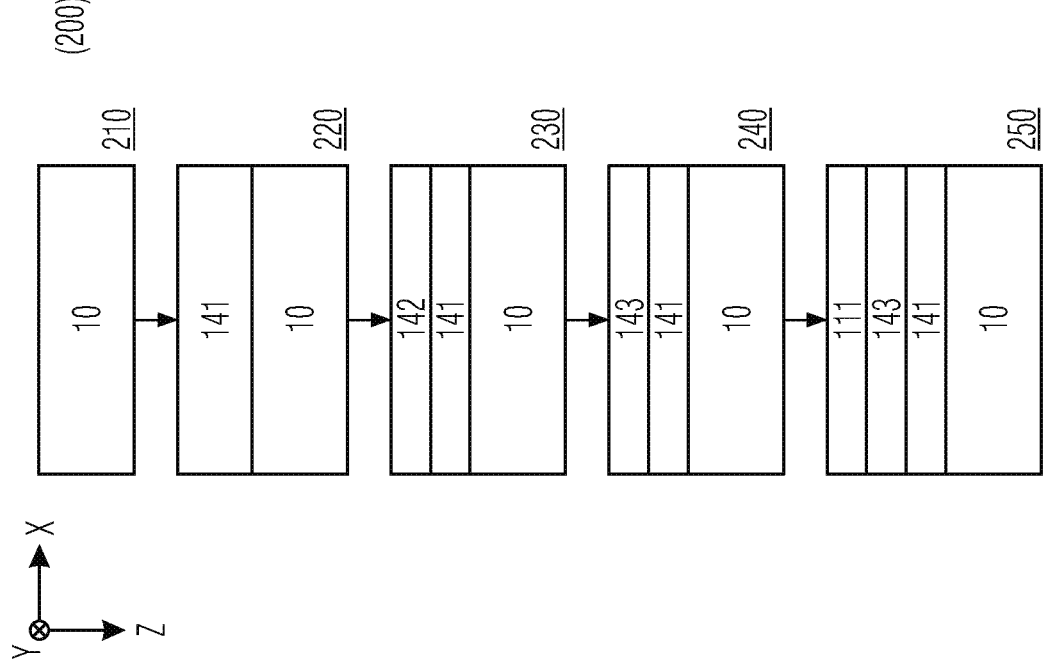

With respect to FIG. 1B, one or more embodiments of a method 200 of producing a power semiconductor device shall be described in more detail. In the first step 210 the semiconductor body 10 is provided.

In a subsequent step 220 the polycrystalline semiconductor region 141 is formed at the semiconductor body 10. For example, the polycrystalline semiconductor region 141 is deposited on an upper surface of the semiconductor body 10. Said surface of the semiconductor body 10 may comprise on or more layers at its upper surface, for example one or more insulating layers and/or one ore more passivation layers. For example, the semiconductor body 10 may include an oxide layer (not depicted in FIG. 1B) at its upper surface. In this example, the polycrystalline semiconductor region 141 may be deposited In a subsequent step 230, the amorphous sublayer 142 is formed at the polycrystalline semiconductor region 141. For example, the polycrystalline semiconductor region 141 is subjected to a damage implantation processing step. By the damage implantation processing step, at least a part of the polycrystalline semiconductor region 141 may be amorphized. In other words, the amorphous sublayer 142 may be formed by amorphizing at least a part of the polycrystalline semiconductor region 141.

Subsequently in step 240, the amorphous sublayer 142 is subjected to a re-crystallization processing step to form a re-crystallized sublayer 143. The re-crystallized sublayer 143 may be formed by recrystallizing the amorphous sublayer 142 or at least a part of the amorphous sublayer 142. The re-crystallization processing step does not need to be carried out directly after step 230. Other processing steps, related or not related to the polycrystalline semiconductor region 141 may be carried out in between. For example, an implantation in other areas of the semiconductor body 10 may be carried out and the annealing be used for simultaneously activating the dopant in the other areas and performing the re-crystallization.

Subsequently in a step 250, a metal layer 111 is formed at the re-crystallized sublayer 143. For example, the metal layer 111 is deposited in direct contact to the re-crystallized sublayer 143, e.g. on a surface of the re-crystallized sublayer 143. In another embodiment, the metal layer 111 may be deposited in indirect contact to the re-crystallized sublayer 143, e. g. via one or more layers in-between. Said one or more layers in-between the metal layer 111 and the re-crystallized sublayer 143 may be electrically conductive to electrically connect the metal layer 111 and the re-crystallized sublayer 143.

With respect to FIG. 1C, a further embodiment of a method 300 of producing a power semiconductor device is described. In a step 310 the semiconductor body 10 is provided.

In a step 320 a first insulation layer 192, e. g. comprising a first oxide layer and/or a first nitride layer, is formed at the semiconductor body 10. The first insulation layer 192 may be formed at least at a part of the surface of the semiconductor body 10.

In a step 330 the polycrystalline semiconductor region 141 is formed at the semiconductor body 10. For example, the polycrystalline semiconductor region 141 is formed directly at the semiconductor body 10 (directly on the upper surface of the semiconductor body 10) and/or indirectly at the semiconductor body 10 (on the surface of the first insulation layer 192 and in mechanical connection to the semiconductor body 10). For example, the polycrystalline semiconductor region 141 is formed unstructured, e. g. extending over the first insulation layer 192 as well as the upper surface of the semiconductor body 10.

In a step 340 the amorphous sublayer 142 is formed at the polycrystalline semiconductor region 141. For example, the polycrystalline semiconductor region 141 is subjected to a damage implantation processing step. By the damage implantation processing step, at least a part of the polycrystalline semiconductor region 141 may be amorphized.

In a step 350, the amorphous sublayer 142 is subjected to a re-crystallization processing step to form the re-crystallized sublayer 143. The re-crystallized sublayer 143 may be formed by recrystallizing the amorphous sublayer 142 or at least a part of the amorphous sublayer 142.

In an optional step 360, the polycrystalline semiconductor region 141 and the re-crystallized sublayer 143 are subjected to a structuring step. During the structuring step, the polycrystalline semiconductor region 141 and the re-crystallized sublayer 143 may be structured in a lateral direction. For example, parts of the polycrystalline semiconductor region 141 and the re-crystallized sublayer 143 may be etched away. However, there are different techniques known for structuring polycrystalline semiconductor material, which, for the sake of brevity, are not described in detail here.

In an optional step 370, a second insulation layer 193, e. g. comprising a second oxide layer and/or a second nitride layer, is formed above the polycrystalline semiconductor region 141 and/or the re-crystallized sublayer 143. The second insulation layer 193 may be formed at least above a part of the surface of the re-crystallized sublayer 143. Within the second insulation layer 193 at least one first opening 112 for re-crystallized sublayer 143 may be formed. Within the second insulation layer 193 at least one second opening 113 for contacting a part of the semiconductor body 10.

In a step 380, the metal layer 111 is arranged at the re-crystallized sublayer 143. For example, the metal layer 111 is arranged in direct contact to the re-crystallized sublayer 143. The metal layer 111 may contact the re-crystallized sublayer 143 through the at least one first opening 112 of the second insulation layer 193.

Hence, in accordance with an embodiment, a power semiconductor device may be provided where a polycrystalline semiconductor region is coupled to a metal layer via a re-crystallized sublayer. The re-crystallized sublayer has been produced by first forming the amorphous sublayer and at least partially converting it, by said re-crystallization processing step to form a re-crystallized sublayer.

Examples of such power semiconductor device will be explained with respect to FIGS. 2 and 3. First, however, optional aspects of the method described above shall be described:

Now referring to FIGS. 1A to 1C, in an embodiment, the step 230 of forming the amorphous sublayer includes the damage implantation processing step. For example, during the damage implantation processing step, heavy ions may be implanted. The heavy ions can have a mass equal or greater than the mass of phosphorus ions (e.g., an atomic mass greater or equal than 30,973762 u). The heavy ions that may be implanted for forming the amorphous sublayer may include one or more of argon, Ar, boron, B, neon, Ne, arsenic, As, boron-difluoride, BF2, trihydridoboron, BH3.

In another embodiment, ions including one or more of silicon, Si, phosphorus, P, germanium, Ge, arsenic, As, sulfur, S, and krypton, KR may be implanted for forming the amorphous sublayer.

For example, the dose applied during the damage implantation is greater than $1*10^{13}$ cm$^{-2}$, or greater than $5*10^{13}$ cm$^{-2}$, or greater than $1*10^{14}$ cm$^{-2}$, or greater than $5*10^{14}$ cm$^{-2}$. For example, the energy applied during the damage implantation is greater than 15 keV, or greater than 30 keV, or greater than 50 keV, or greater than 80 keV.

In yet another embodiment, the step 230 of forming the amorphous sublayer includes a deposition processing step. For example, during the deposition processing step, the amorphous sublayer is deposited, e. g. on a surface of the polycrystalline semiconductor region.

In step 220, the polycrystalline semiconductor region 141 may, for example, be formed laterally structured or unstructured. In an embodiment, the deposition may be carried out in a laterally structured manner, resulting in the polycrystalline semiconductor region 141 being laterally structured. In another embodiment, the deposition may be carried out in a laterally unstructured manner, resulting in the polycrystalline semiconductor region 141 not being laterally structured. In some embodiments, step 220 may include a structuring step, during which a lateral structuration of the polycrystalline semiconductor region 141 is performed. For example, during the structuring step, parts of the formerly unstructured polycrystalline semiconductor region 141 are removed, resulting in the polycrystalline semiconductor region 141 being laterally structured. The step 230, in particular the damage implantation step, may, depending on the respective embodiment, be carried out with the polycrystalline semiconductor region 141 being either laterally structured or unstructured.

In an embodiment, the damage implantation is carried out as an unmasked or blanket implantation into an unstructured polycrystalline semiconductor region 141. In this case the implantation does not change or influence any layer below the polycrystalline semiconductor region 141 like the semiconductor body 10, the first insulation layer 192 or other layers or semiconductor regions. After the implantation, the polycrystalline semiconductor region 141 together with the amorphous sublayer 142 may be laterally structured. Be performing this structuring after the implantation, the later removed parts of the polycrystalline semiconductor region 141 may act as a mask.

In another embodiment, the damage implantation is carried out as an unmasked or blanket implantation into a structured polycrystalline semiconductor region 141. For example, based on the unmasked implantation, the implanted ions are not only directed to the polycrystalline semiconductor region, but also to other regions of the semiconductor body. Accordingly, in an example, the damage implantation is carried out to not only form the amorphous sublayer, but also to form a doped semiconductor region 101 in the semiconductor body.

The amorphous sublayer may be formed based on an amorphization processing step or, respectively, based on a deposition processing step. In the latter case, the polycrystalline semiconductor region is covered by the (additional) amorphous sublayer, and in the first case, an upper portion of the polycrystalline semiconductor region is "converted" into the amorphous sublayer.

The amorphous sublayer 142 is, at least partially or, respectively, completely, re-crystallized to form the re-crystallized sublayer 143. For example, such re-crystallization is based on a temperate annealing processing step.

The polycrystalline semiconductor region 141 can be based on silicon. In other embodiments, the polycrystalline semiconductor region 141 is based on a semiconductor material different from silicon.

The metal layer can be based on at least one of aluminum (Al), silicon (Si), and copper (Cu). For example, the metal layer may comprise Al, AlSi, AlSiCu, or AlCu. For example, based on the amorphous sublayer 142 that has been re-crystallized, dissolution of silicon into AlSiCu may be prevented.

Figure 2:
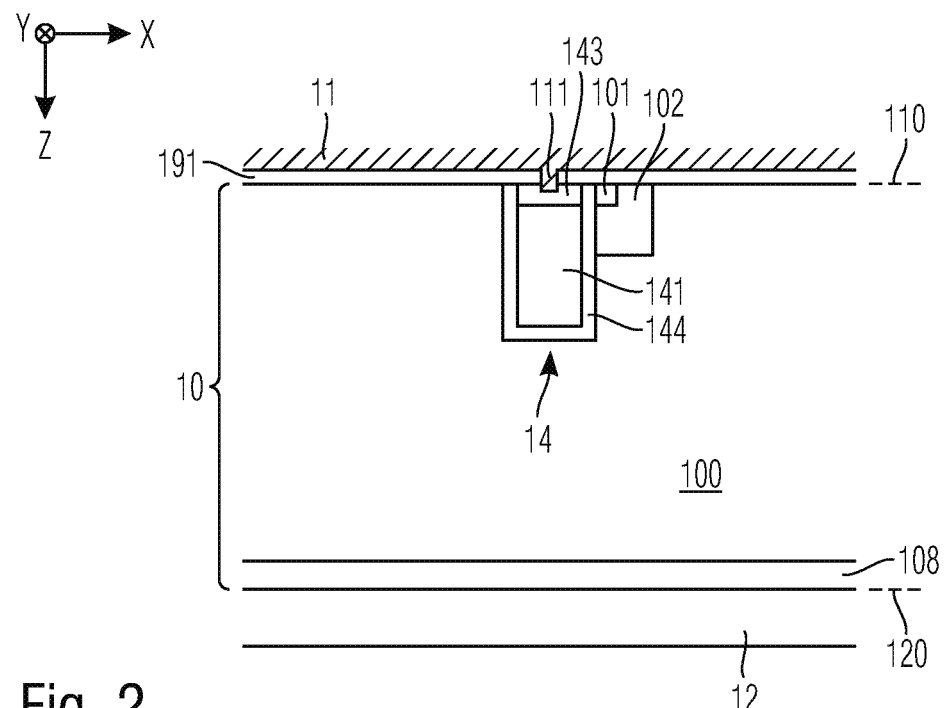
FIG. 2 schematically and exemplarily illustrates a section of a vertical cross-section of a power semiconductor device in accordance with one or more embodiments.
Figure 3:
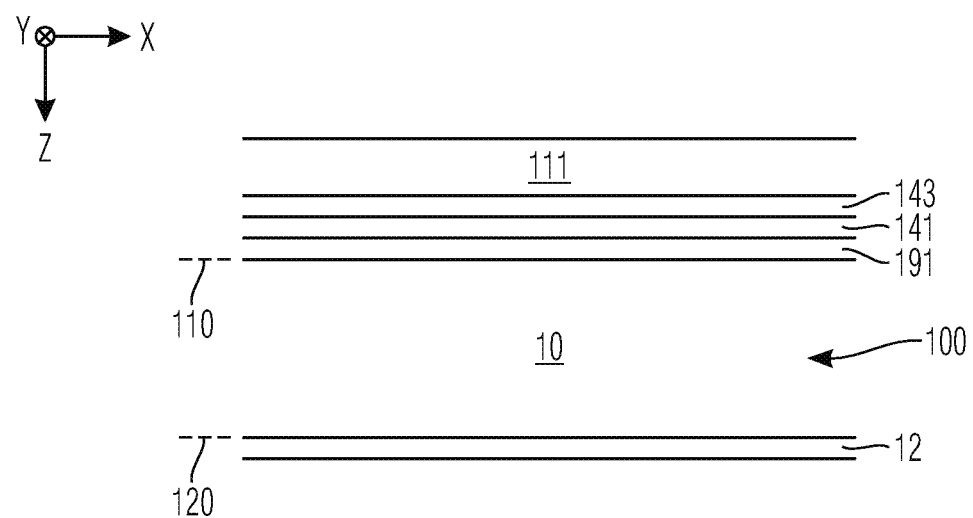
FIG. 3 schematically and exemplarily illustrates a section of a vertical cross-section of a power semiconductor device in accordance with one or more embodiments.
Figure 4:
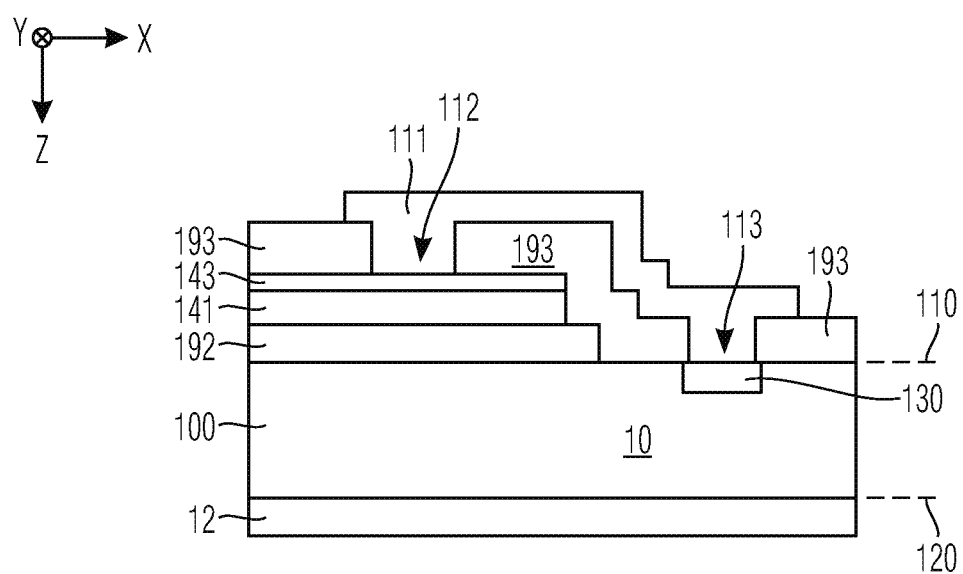
FIG. 4 schematically and exemplarily illustrates a section of a vertical cross-section of a power semiconductor device in accordance with one or more embodiments.

FIGS. 2, 3, and 4 illustrate embodiments of a power semiconductor device 1. Referring to FIGS. 2, 3, and 4 the power semiconductor device 1 has a semiconductor body 10 and, e.g., coupled thereto, a first terminal 11 and a second terminal 12. Both, the first terminal 11 and the second terminal 12 are not depicted in FIG. 4.

The first terminal 11 may be a load terminal, and the second terminal 12 may also be a load terminal. In some embodiments, the semiconductor device 1 may further comprise a control terminal.

If both terminals 11 and 12 are implemented as load terminals, the power semiconductor device 1 can be configured for conducting a load current between the first load terminal 11 and the second load terminal 12. The first load terminal 11 may be arranged at a first side 110 of the semiconductor body 10, wherein the first side 110 may be a frontside. The second load terminal 12 may also be arranged at a first side 110 of the semiconductor body 10, or, alternatively, as illustrated, at a second side 120 of the semiconductor body 10, wherein the second side 120 may be a backside.

In an embodiment, a metal layer 111 may be part of the first terminal 11 or be connected to the first terminal 11. In other embodiments, the metal layer 111 or parts of the metal layer 111 may not be electrically connected to the first terminal 11 or even be electrically insulated from the first terminal 11. The metal layer 111 can be based on at least one of aluminum (Al), silicon (Si), and copper (Cu). For example, the metal layer 111 may comprise Al, AlSi, AlSiCu, or AlCu. The first terminal 11 can be based on at least one of aluminum (Al), silicon (Si), and copper (Cu). For example, the first terminal 11 may comprise Al, AlSi, AlSiCu, or AlCu.

The semiconductor body 10 can exhibit any configuration, such as a diode configuration, a MOSFET configuration, an IGBT configuration or a derivate thereof. According to the configuration, the semiconductor body 10 may comprise several doped regions. These configurations are principally known to the skilled person and will hence not described here in more detail. On a general level, the semiconductor body 10 may comprise a first doped region 101 at the first side 110 and a second region 102 at the first side 110. Typically, the major portion of the semiconductor body 10 is formed by a drift region 100. For example, metal layer 111 may be arranged on the first side 110.

In an embodiment, the power semiconductor device 1 includes said polycrystalline semiconductor region 141. E.g., the polycrystalline semiconductor region 141, for example together with the sublayer 143, forms one of a source trench electrode (cf. FIG. 2), a field plate electrode (cf. FIG. 3), a planar field plate electrode (cf. FIG. 4), or a control trench electrode (cf. FIG. 2). The polycrystalline semiconductor region 141 may be arranged in an active region of the power semiconductor device 1, in an edge termination region of the power semiconductor device 1 (which may surround the active region) and/or in a transition region between the active region and the edge termination region.

For example, in case of a diode, the first doped region 101 can be an anode region of the second conductivity type (and the second doped region 102 may be omitted), the drift region 100 is of the first conductivity type, and a third doped region 108 at the second side is a field stop region also of the first conductivity type but exhibiting a greater dopant concentration as compared to the drift region 100.

In case of an IGBT or MOSFET, the first doped region 101 may be source region of the first conductivity type, the second doped region 102 may be a body region of the second conductivity type. The first terminal 11 may be separated from the semiconductor body based on an insulation layer 191. E.g., a polycrystalline semiconductor region 141, for example together with a sublayer 143, may form a source electrode or a control electrode in a trench 14 and can be isolated from the semiconductor body 10 based on trench insulator 144 (cf. FIG. 2). The electrode, e.g. the source electrode or the control electrode, within the trench 14 is contacted via the metal layer 111. In case of a source electrode, the metal layer 111 may contact the first load terminal 11 and in case of a control electrode, the metal layer 111 may contact the control terminal.

Or, also in case of an IGBT or MOSFET, the polycrystalline semiconductor region 141, for example together with a sublayer 143, may form a field plate electrode separated from the semiconductor body 10 based on the insulation layer 191 (cf. FIG. 3) or the first insulation layer 192 (cf. FIG. 4). Alternatively, the polycrystalline semiconductor region 141 may form a gate runner, a source runner, a diode, a resistor, an interconnect, a gate structure, or a transistor (TFT).

Portions of the power semiconductor devices 1 illustrated in FIGS. 2, 3, and 4 may have been formed in accordance with an embodiment of the method described above.

In case of the polycrystalline semiconductor region 141 forming a field plate electrode and the first terminal 11 being configured as load terminal, the polycrystalline semiconductor region 141 may be electrically connected to the first terminal 11, e. g. with a low ohmic connection (for example less than 60 ohms) or with a high ohmic connection (for example 60 to 500 ohms), or the polycrystalline semiconductor region 141 may be electrically insulated from to the first terminal 11.

In case of the polycrystalline semiconductor region 141 forming a control electrode, the polycrystalline semiconductor region 141 may be electrically connected to the control terminal.

Still referring to FIGS. 2, 3, and 4, in an embodiment, the power semiconductor device 1 further includes between and in contact with both the metal layer 111 and the polycrystalline region 141, a sublayer 143. In an embodiment, the sublayer 143 is the re-crystallized sublayer formed in accordance with an embodiment of the method described above. That is, the sublayer 143 may have been produced by subjecting a portion of the polycrystalline semiconductor region 141 to an amorphization processing step and a subsequent re-crystallization processing step. The sublayer 143 may separate the semiconductor region 141 from the metal layer 111. As a result of the modification of material properties during the re-crystallization processing step, the sublayer 143 may form a dissolution barrier against the metal layer 111.

In an embodiment, an average grain size in the sublayer 143 is greater than 120% of an average grain size in the polycrystalline semiconductor region 141. The average grain size in the sublayer 143 can be even greater than 140%, or even greater than 160% of the average grain size in the polycrystalline semiconductor region 141. The sublayer 143 may separate the semiconductor region 141 from the metal layer 111. As a result of the different grain size, the sublayer 143 may form a dissolution barrier against the metal layer 111.

For example, the metal layer 111 may be partly separated from the sublayer 143 by the second insulation layer 193, only contacting the sublayer 143 through at least one first opening 112 of the second insulation layer 193. For example, the metal layer 111 may be separated from the semiconductor body 10 by a second insulation layer 193, optionally contacting a part of the semiconductor body 10 only through at least one second opening 113 of the second insulation layer 193.

In addition to the provision related grain size or in alternative thereto, the sublayer 143 may include implantation impurities having a mass equal or greater than the mass of phosphorus ions, in accordance with an embodiment. The implantation impurities may include one or more of argon, Ar, boron, B, neon, Ne, arsenic, As, boron-difluoride, BF2, trihydridoboron, BH3. Or, the implantation impurities in the sublayer 143 include one or more of silicon, Si, phosphorus, P, germanium, Ge, arsenic, As, sulfur, S, and krypton, KR. In an embodiment, the (heavier) implantation impurities included in the sublayer 143 are not present in the polycrystalline semiconductor region 141. In an embodiment, an average concentration of the non-doping implantation impurities included in the sublayer 143 is at least by a factor of ten, or even by a factor of 100, greater than an average concentration of the non-doping implantation impurities in the polycrystalline semiconductor region 141. After the implantation, molecules may, of course, separate into smaller molecules and/or atoms. For example, BF2 may exist separated into boron and hydrogen or BH3 may exist separated into boron and hydrogen within the fully manufactured semiconductor. The implantation impurities may, for example, result from an ion implantation process.

In an embodiment, a thickness of the sublayer 143 is within the range of 20% to 100% of the thickness of the polycrystalline region 141, or within the range of 20% to 90%, or within the range of 20% to 80%, or within the range of 20% to 50% of the thickness of the polycrystalline region 141. Alternatively or additionally, the thickness of the sublayer 143 may be greater than 50 nm, or even greater than 100 nm.

In an embodiment, the first doped semiconductor region 101 is arranged adjacent to the polycrystalline semiconductor region 141 and includes implantation impurities of the same type as in the sublayer 143. That is, the first doped semiconductor region 101 and the sublayer 143 may be formed based on joint processing steps. E.g., said damage implantation processing step carried out for forming the amorphous sublayer 142 is used to simultaneously form the first doped semiconductor region 101.

As depicted in FIG. 4, the semiconductor body 10 may optionally comprise a doped region 130, e.g. a channel stopper region or p-ring region 130. For example, the doped channel stopper region or p-ring region 130 may be of the second conductivity type. The doped channel stopper or p-ring region 130 may be arranged in the edge termination region of the power semiconductor device 1 (which may surround the active region) and/or in a transition region between the active region and the edge termination region. The metal layer 111 may electrically connect the doped channel stopper or p-ring region 130 with the polycrystalline semiconductor region 141 forming a field plate. The second insulation layer 193 may comprise at least one second opening 113 for contacting the doped channel stopper or p-ring region 130 within the semiconductor body 10.

As described above, the power semiconductor device 1 may exhibit various configurations, e.g., a diode configuration, a MOSFET configuration, an IGBT configuration or a configuration derived from these basic configurations. Accordingly, the first terminal 11 can be a load terminal, such as an emitter terminal, a source terminal or an anode terminal, or a control terminal, such as a gate terminal. The polycrystalline semiconductor region 141 may accordingly form, e.g., an electrode included in a trench 14 and insulated from the semiconductor body 10 (e.g., a source trench electrode or a gate trench electrode), or a field plate electrode electrically connected to the first terminal, or contact (e.g., a sensor electrode or a contact plug) contacting a portion of the semiconductor body 10.

Irrespective of the position, size, configuration and the function of the polycrystalline semiconductor region 141, due to the sublayer 143, dissolution of its semiconductor material into the metal layer 111 maybe avoided or, respectively, reduced.

In the above, embodiments pertaining to a power semiconductor device and corresponding production methods were explained. For example, these power semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed. For example, the above-described values of the dopant concentrations and dopant doses are related to embodiments where Si is chosen as the material of the semiconductor body 10.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), aluminum gallium nitride (AlGaN) and aluminum indium nitride (AlInN). For power semiconductor switches applications currently mainly Si, SiC, GaAs and GaN materials are used.

According to further embodiments, a dopant implantation step may be part of the method, the dopant implantation step being separate from the damage implantation processing step. During the dopant implantation step different ions than during the damage implantation processing step may be implanted. Species implanted during the damage implantation processing step may non-doping. For example, non-doping species, e.g. neon, argon, krypton, xenon, are implanted during the damage implantation processing step and doping species, e.g. at least one of phosphorous, arsenic, antimony, boron, indium, aluminum, gallium, are implanted during the dopant implantation step.

For example, the dopant implantation step may be carried out after the forming 230 the amorphous sublayer 142 or, more particular, after the damage implantation processing step. In another example, the dopant implantation step may be carried out after the re-crystallization processing step. The dopant implantation step may be carried out prior to forming 250 the metal layer at the re-crystallized sublayer.

For example, the dopant implantation step may be carried out prior to forming 230 the amorphous sublayer 142 or, more particular, prior to the damage implantation processing step. Furthermore, the dopants implanted during the dopant implantation step may be activated prior to forming 230 the amorphous sublayer 142 or, more particular, prior to the damage implantation processing step.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of producing a power semiconductor device, the method comprising:
providing a semiconductor body;
forming, at the semiconductor body, a polycrystalline semiconductor region, wherein forming the polycrystalline semiconductor region includes a structuring step during which a lateral structuration of the polycrystalline semiconductor region is performed to form a laterally structured polycrystalline semiconductor region;
forming, at the polycrystalline semiconductor region, an amorphous sublayer, wherein forming the amorphous sublayer includes a damage implantation processing step, wherein the damage implantation processing step is carried out as an unmasked implantation to form a doped semiconductor region in the semiconductor body adjacent to the laterally structured polycrystalline semiconductor region;
subjecting the amorphous sublayer to a re-crystallization processing step to form a re-crystallized sublayer; and
forming a metal layer at the re-crystallized sublayer.

2. The method of claim 1, wherein the damage implantation processing step includes implanting heavy ions.

3. The method of claim 2, wherein the heavy ions have a mass equal to or greater than the mass of phosphorus ions.

4. The method of claim 2, wherein the heavy ions include one or more of argon, boron, neon, arsenic, boron-difluoride, and trihydridoboron.

5. The method of claim 1, wherein a dose applied during the damage implantation processing step is greater than $1*10^{13}$ cm$^{-2}$ and/or wherein an energy applied during the damage implantation processing step is greater than 15 keV.

6. The method of claim 1, wherein the polycrystalline semiconductor region is formed as a laterally unstructured layer, and wherein the damage implantation processing step is carried out as an unmasked implantation.

7. The method of claim 1, further comprising a dopant implantation step being separate from the damage implantation processing step.

8. The method of claim 7, wherein species implanted during the damage implantation processing step are non-doping.

9. The method of claim 7, wherein the dopant implantation step is carried out after the re-crystallization processing step.

10. The method of claim 7, wherein the dopant implantation step is carried out prior to the damage implantation processing step.

11. The method of claim 1, wherein forming the amorphous sublayer includes a deposition processing step or an amorphization processing step.

12. The method of claim 1, wherein the re-crystallization processing step includes a temperature annealing processing step.

13. The method of claim 1, wherein the polycrystalline semiconductor region is based on silicon.

14. The method of claim 1, wherein the metal layer comprises Al, Cu, AlSi, AlSiCu, or AlCu.

15. The method of claim 1, further comprising:
forming a first insulation layer at the semiconductor body, wherein during the forming of the polycrystalline semiconductor region, the polycrystalline semiconductor region is formed at least partly above the first insulation layer; and/or
forming a second insulation layer at the re-crystallized sublayer, wherein during the forming of the metal layer, the metal layer is formed at least partly above the second insulation layer.

16. A method of producing a power semiconductor device, the method comprising:
providing a semiconductor body;
forming, at the semiconductor body, a polycrystalline semiconductor region;
forming, at the polycrystalline semiconductor region, an amorphous sublayer, wherein forming the amorphous sublayer includes a damage implantation processing step;
subjecting the amorphous sublayer to a re-crystallization processing step to form a re-crystallized sublayer;
performing a dopant implantation step separate from the damage implantation processing step, wherein the dopant implantation step is carried out after the re-crystallization processing step; and
forming a metal layer at the re-crystallized sublayer.

17. A method of producing a power semiconductor device, the method comprising:
providing a semiconductor body;
forming, at the semiconductor body, a polycrystalline semiconductor region;
forming, at the polycrystalline semiconductor region, an amorphous sublayer;
subjecting the amorphous sublayer to a re-crystallization processing step to form a re-crystallized sublayer;
forming a metal layer at the re-crystallized sublayer; and
at least one of:
forming a first insulation layer at the semiconductor body, wherein during the forming of the polycrystalline semiconductor region, the polycrystalline semiconductor region is formed at least partly above the first insulation layer; and
forming a second insulation layer at the re-crystallized sublayer, wherein during the forming of the metal layer, the metal layer is formed at least partly above the second insulation layer.

* * * * *